(12) United States Patent
Spitz et al.

(10) Patent No.: US 7,201,852 B1
(45) Date of Patent: Apr. 10, 2007

(54) METHOD FOR REMOVING DEFECTS FROM SILICON BODIES BY A SELECTIVE ETCHING PROCESS

(75) Inventors: Richard Spitz, Reutlingen (DE); Helga Uebbing, Reutlingen (DE); Doerte Eimers-Klose, Reutlingen (DE); Franz Laermer, Stuttgart (DE); Andrea Schilp, Schwaebisch Gmuend (DE)

(73) Assignee: Robert Bosch GmbH, Stuttgart (DE)

( * ) Notice: Subject to any disclaimer, the term of this patent is extended or adjusted under 35 U.S.C. 154(b) by 977 days.

(21) Appl. No.: 09/720,720

(22) PCT Filed: Apr. 26, 2000

(86) PCT No.: PCT/DE00/01295

§ 371 (c)(1),
(2), (4) Date: Feb. 28, 2001

(87) PCT Pub. No.: WO00/67312

PCT Pub. Date: Nov. 9, 2000

(30) Foreign Application Priority Data

Apr. 29, 1999 (DE) ................................ 199 19 471

(51) Int. Cl.
*C03C 15/00* (2006.01)
(52) U.S. Cl. ........................... 216/63; 216/79; 216/80; 438/719
(58) Field of Classification Search .................. 216/79, 216/80, 65, 63; 438/719, 725, 80
See application file for complete search history.

(56) References Cited

U.S. PATENT DOCUMENTS

| 5,350,480 | A | | 9/1994 | Gray |
| 5,693,182 | A | | 12/1997 | Mathuni |
| 5,763,326 | A | * | 6/1998 | Barth .......................... 438/714 |
| 6,077,451 | A | * | 6/2000 | Takenaka et al. .............. 216/79 |
| 6,124,211 | A | * | 9/2000 | Butterbaugh et al. ........ 438/708 |
| 6,136,137 | A | * | 10/2000 | Farnworth et al. .......... 156/344 |
| 6,162,367 | A | * | 12/2000 | Tai et al. ....................... 216/2 |
| 6,211,010 | B1 | * | 4/2001 | Lee et al. .................... 438/255 |
| 6,432,838 | B1 | * | 8/2002 | Choi et al. ................... 438/758 |

FOREIGN PATENT DOCUMENTS

| DE | 35 06 995 | 8/1986 |
| EP | 0 878 824 | 4/1998 |
| JP | 03 012921 | 1/1991 |
| JP | 08 031785 | 2/1996 |

OTHER PUBLICATIONS

Patent Abstract of Japan, vol. 015, No. 125 (1-1050) (Mar. 27, 1991).
Patent Abstract of Japan, vol. 1996, No. 06 (Jun. 28, 1996).

* cited by examiner

*Primary Examiner*—Duy-Vu N. Deo
*Assistant Examiner*—Binh X. Tran
(74) *Attorney, Agent, or Firm*—Kenyon & Kenyon LLP

(57) ABSTRACT

A method for eliminating eruptions, impurities, and/or damage in a crystal lattice by selectively etching silicon elements of surface-plated and sawn-out parts of a silicon wafer. At least areas of the silicon elements are brought into contact with a gaseous etching medium that etches silicon selectively in a chemical reaction, and gaseous reaction products are produced during etching. An interhalogen or fluorine-noble gas compound that is in a gaseous state or was converted to the gaseous phase may be used as the etching medium. The method is believed to be suitable for producing power diodes sawn from a wafer or for overetching fully mounted individual diodes.

17 Claims, No Drawings

METHOD FOR REMOVING DEFECTS FROM SILICON BODIES BY A SELECTIVE ETCHING PROCESS

FIELD OF THE INVENTION

The present invention relates to a method for eliminating eruptions, impurities, and/or damage in the crystal lattice by selectively etching silicon elements in particular of surface-plated parts of a silicon wafer.

BACKGROUND INFORMATION method for producing silicon power diodes involves cutting number of individual diodes from a silicon wafer that has been doped on both sides with an n- or p-type dopant in full-surface doping steps to generate a pn junction and subsequently plated all over on both sides, by first sawing the entire wafer into squares or hexagons measuring roughly 5×5 $mm^2$ and then suitably building up and electrically bonding such individual silicon surface diodes. The silicon wafer is doped and plated in an available manner, with the surface plating layer being made, for example, of a chromium-nickel-vanadium-silver alloy (CrNiVAg).

The sawing step, which is necessary to produce individual diodes from the silicon wafer, may results in irregular eruptions on the sawn edge or impurities and damage in the crystal lattice so that the pn junctions in the sawn-out individual diodes are partially or regionally damaged. This damage then leads to higher leakage currents, which, in the end, renders the created diode unusable at this stage.

Therefore, in methods for producing silicon power diodes of this type, the sawing step must be followed by a wet-chemical overetching of the diodes, thus stripping the damaged silicon areas and restoring a suitably intact crystal lattice in the pn junction region.

In such methods, the chemical etch-stripping of the damaged silicon areas may be by passivation of the exposed silicon edge to protect the pn junctions against environmental influences and to reliably prevent the electronic properties from again deteriorating over the life of the diode.

However, it is believed that there are at present no satisfactory means of etch-stripping the damaged silicon areas at the sawn edge. The available wet-chemical etching method results, for example, in unfavorable etching profiles with greater risk of electrical breakdown, due to its pronounced doping selectivity, as well as in disadvantageous yields, due to occasional rejects during etching. In addition, the etching profile produced by wet-chemical etching also reduces the diode's mechanical stability.

Furthermore, according to the available methods, only the fully mounted diodes are exposed to the aqueous etching solution, which involves expensive handling of the individual diodes. To summarize, therefore, the available methods for overetching silicon elements sawn out of a silicon wafer include by the following process steps:

Wet-chemical etching of the sawn-out silicon elements, i.e., diodes, mounting of the diodes, immersion of the mounted diodes in etching baskets into etching basins, neutralization of the etching solution, and subsequent thorough rinsing and drying of the diodes.

The agents needed for these methods are an etching solution, a neutralization solution, and hydrogen peroxide, resulting in serious environmental pollution due to the materials used as well as high energy consumption and the use of de-ionized water. Thus, wet-etching takes place, for example, at temperatures above 90° C., and a rinsing cascade is needed for subsequent cleaning of the etched, mounted diodes.

SUMMARY OF THE INVENTION

The exemplary method according to the present invention is believed to have the advantage that it can be used to etch silicon elements, in particular surface-plated, sawn-out parts of a silicon wafer, using a gaseous etching medium that selectively etches almost exclusively silicon through a chemical reaction, thus producing gaseous reaction products. During this selective etching process, surface eruptions and/or impurities, and/or damage in the crystal lattice of the silicon element, in particular, are eliminated at the same time. The exemplary method according to the present invention is believed to be further advantageously suitable for stripping damaged silicon zones, in particular of sawn-out silicon elements, like those that occur, for example, when producing silicon power diodes. It is reliable, economical, and overcomes the disadvantages of fluid etching media.

One particular advantage is that the exemplary method according to the present invention is a "batch process", i.e., a process on the wafer level. Thus, one particular advantage is that the individual chips do not need to be handled, which means that all sawn-out silicon elements, i.e., chips, of a wafer can be etched simultaneously, which saves a great deal of space and requires only one process step i.e., handling step. If necessary, the exemplary method according to the present invention can also be used to overetch fully mounted individual diodes, as is currently the case. In doing this, it is necessary only to replace the wet-etching process that is known per se with an etching process using a gaseous etching medium.

A further advantage is that the exemplary method according to the present invention for selective etching does not use a fluid, thus achieving a clean gas-phase etching of the silicon elements that have been, in particular, sawn out. Moreover, the exemplary method according to the present invention is also less selective toward doping concentrations, resulting in advantageous etched edge profiles and, in particular, prevents a "boron balcony" from forming on the sawn-out and overetched diodes, at the same time increasing mechanical stability and reducing failure rates.

Another advantage is believed to be the selective removal of damaged silicon zones, eruptions or impurities, as well as the planarizing effect of the exemplary method according to the present invention. Due to the high selectivity of the gaseous etching medium used and the chemical reaction that this produces on the surface of the silicon element, and particularly due to the selectivity of this reaction on damage in these zones, it is possible to etch-strip significantly more material, with damaged areas automatically undergoing more aggressive etching, particularly in the edge areas of the sawn-out silicon elements.

Thus, the exemplary method according to the present invention offers the advantage that the etching rates can be selectively adjusted, for example via the composition of the gaseous etching medium. This makes it possible to set, if necessary, low etch-stripping rates, thereby increasing reproducibility and thus reducing overall process time. However, it is also possible to set very high etching rates, particularly when using chlorine trifluoride or bromine trifluoride, and thus significantly shorten the actual etching time.

The very high selectivity of the exemplary method according to the present invention toward non-silicon materials is due to a surface-catalytic initiation of the etching reaction, so that a large number of materials are also advantageously suitable for use as the etching mask.

For example, even a surface-plating of the silicon wafer, which serves as the later diode plating, can be used as the etching mask while etching with the gaseous etching medium without this plating itself being significantly corroded. Another advantage in this regard is that a sawing sheet used and an adhesion layer provided between this sawing sheet and the silicon wafer attached to it are also not significantly corroded, due to the high selectivity of the etching medium toward non-silicon materials. Furthermore, an additional lacquer layer can be advantageously applied all over in a manner that is known per se, for example by spin-coating, thus further protecting the surface plating of the silicon wafer.

In the case of the interhalogen or fluorine-noble gas compounds suitable for the exemplary method according to the present invention, suitable process conditions further ensure that no free chlorine, bromine or iodine occurs, leaving only a very low risk of corrosion after completion of the etching process.

Further advantages of the exemplary method according to the present invention include low energy consumption because there is no need to heat, for example, the diodes or etching baths, low chemical consumption, and environmental compatibility. For example, any waste gases produced can be very easily disposed of without harmful effects through after-treatment, eliminating hazardous waste. An exemplary method includes washing the waste gases in lime water, i.e., an aqueous calcium hydroxide solution in a "gas washer" ($Ca(OH)_2 + 2HF \rightarrow CaF_2 \downarrow + 2H_2O$).

Chlorine trifluoride, bromine trifluoride, iodine pentafluoride, or xenon difluoride that are in a gaseous state or have been converted to the gaseous phase, or a mixture of these compounds, are particularly suitable as the etching medium. In this case, silicon tetrafluoride, for example, is produced as the reaction product.

DETAILED DESCRIPTION exemplary method according to the present invention for eliminating eruptions, impurities, or damage in the crystal lattice of silicon elements by selective etching of silicon generally makes use of the characteristic of certain fluorine compounds, known as interhalogens or fluorine-noble gas compounds, to spontaneously etch silicon, i.e., through contact between the fluorine compound and silicon, where this etching action takes place from the gaseous phase, and gaseous reaction products are produced. To do this, a gaseous silicon-etching fluorine compound, for example, is supplied to a reaction chamber of any suitably appropriate reactor, in which the silicon elements to be etched were previously placed. Adsorption of the gas molecules of the gaseous etching medium on the accessible silicon surfaces results in spontaneous, surface-catalytic fragmentation of the etching medium used, thus releasing fluorine radicals that react with the silicon to form a volatile product, for example $SiF_x$ (x=2, 3, 4). The best known product of a reaction of this type is, for example, stable silicon tetrafluoride $SiF_4$. The mechanism, can be described as follows, where X is Cl, Br, I or Xe, and n is the number of fluorine atoms in the particular compound:

1. Adsorption: $XF_n \rightarrow XF_n^{adsorb}$

2. Surface-catalytic decomposition: $XF_n^{adsorb} \rightarrow XF_{n-1}^{adsorb} + F^{*,adsorb}$ 3. Chemical transformation: $Si + xF^{*,adsorb} \rightarrow SiF_x$ (x=1, 2, 3, 4)

4. Desorption of reaction products: $SiF_x \rightarrow SiF_x \uparrow$ (x=2, 3, 4) in particular: $Si + 4F^{*,adsorb} \rightarrow siF_4 \uparrow$ Examples of suitable compounds of the $XF_n$ type are the interhalogen compounds chlorine trifluoride, bromine trifluoride and iodine pentafluoride, as well as the noble gas fluoride xenon difluoride. The chlorine trifluoride and bromine trifluoride compounds are available in the semiconductor industry, where they are maybe used to clean wafers or wafer handling devices.

While chlorine trifluoride and bromine trifluoride are liquids with a vapor pressure of 1 bar at 150° C., iodine pentafluoride is a semiliquid, and xenon difluoride is a solid with a vapor pressure of approximately 20 mbar and 2 mbar, respectively, at 15° C. Thus chorine trifluoride and bromine trifluoride can be taken directly from a gas bottle, due to their high vapor pressure, while iodine pentafluoride and xenon difluoride must first be converted to the gaseous phase, using a suitable vaporizing apparatus, preferably at an elevated temperature. When using the liquid iodine pentafluoride, a "bubbler", may be used in which the liquid is "bubbled" with an inert gas, for example helium, as the carrier gas, and the gas mixture is then supplied to the reaction chamber.

In the case of the interhalogen compounds chlorine trifluoride and bromine trifluoride, stripping takes place in a first reaction step of the etching reaction, in which fluorine radicals are released to form stabile chorine fluoride (ClF) and unstable bromine fluoride (BrF), respectively, with two fluorine radicals being generated in each case.

In the case of iodine pentafluoride, the medium is first converted to the relatively stable iodine trifluoride, and in the case of the noble gas fluoride xenon difluoride, elementary xenon is formed in addition to the two fluorine radicals.

When carrying out the exemplary method according to the present invention, one embodiment begins with a silicon wafer from which silicon power diodes are to be produced, with one side of the wafer being doped with an n-type dopant in a manner that, using an all-over doping step, and the other side being doped with a p-type dopant in an available manner using an all-over doping step. A pn-junction thus forms over the entire interior of the silicon wafer. Afterwards, the wafer that has been pretreated in this manner is provided on both sides using an available all-over CrNiVAg, plating method.

This silicon wafer is then attached to a commercially available flexible sawing sheet, made which is know per se, made for example from polyvinyl chloride (PVC) or polycarbonate, using an adhesion layer provided on it, and sawn using an available sawing method into silicon elements measuring approximately 5×5 mm² and shaped like squares or hexagons, with the silicon elements being used as silicon power diodes at the end of the manufacturing process.

After the wafer has been sawn, the sawn-out silicon elements produced are first treated, according to an exemplary method of the present invention, while still attached to the sawing sheet, which means that no individual chips are yet produced at this stage, but only an entire unit of sawn-out silicon elements.

To ensure mechanical stability, the edge of the sawing sheet maybe clamped in a fixed frame during sawing and during the course of the remaining process steps, so that it can be gripped with particular ease and treated automatically. After the wafer has been sawn, the sawing sheet maybe first expanded to increase the distance between the silicon elements and thus give the gaseous etching medium used later on, for example chorine trifluoride, better access to the side walls of the individual sawn-out silicon elements. An expansion frame maybe used for this purpose, forming a stable frame for handling the otherwise flexible sawing sheet.

In any case, it is important to carefully dry the sawn-out silicon elements after sawing the silicon wafer and expanding the sawing sheet, but before etching. This ensures that no moisture enters the reaction chamber of the reactor used later to carry out the actual selective etching of the silicon elements.

In doing this, it is advisable to load the sawn-out silicon elements that have been placed on the sawing sheet and are joined to the wafer into the reaction chamber of the reactor using a loading device, such as a load lock, which includes an evacuation and heating function, for example a radiation heater using corresponding lamps.

Pumping out the loading device to create a vacuum and simultaneously heating the wafer that was sawn into silicon elements and is located on the sawing sheet in the loading device, for example using a radiation heater, removes remnants of moisture particularly efficiently before the wafer that was sawn into silicon elements enters the actual reaction chamber of the reactor, where the described etching reaction takes place after introducing the gaseous etching medium. The presence of moisture greatly encourages corrosion effects at this stage and is therefore undesirable.

To release fluorine radicals, the etching gases used require surface-catalytic decomposition that takes place only in connection with the actual etching reaction with the silicon, which means that the etching reaction is extraordinarily highly selective with respect to non-silicon materials. As a result, the etching conditions can be very easily set, for example by selecting a gaseous etching medium and concentration so that only the silicon surfaces, but not metals or plastics, are significantly corroded by the etching chemicals used.

Thus metal layers, in particular applied surface plating, as well as the sawing sheet used fully satisfy the requirements that an etching reaction mask must meet to strip only a sawn edge damaged during sawing, but not the entire silicon surface. If additional protection of the surface plating or metal layers against even minor etching corrosion is required, this can be easily accomplished by additionally applying, in particular spin-coating, an available lacquer layer onto preferably the entire surface of the silicon wafer.

After the sawn silicon wafer, which has been attached to the sawing sheet and dried, enters the reaction chamber of the reactor, the gaseous etching medium is then introduced into this chamber. When using the interhalogen compounds chlorine trifluoride or bromine trifluoride, the medium is introduced through flow regulators or throttle valves that are known per se, where the process pressure can range from a low-pressure range, i.e., vacuum, to an atmospheric pressure range. Both of the gases mentioned can be used, for example, in conjunction with a process in the pressure range from 0.1 to 1,000 mbar under controlled flow conditions.

If the process is to take place at higher pressures, it is advantageous to dilute the reactive gas with an inert gas, for example helium. Diluting the gas with helium by a factor of 10 to 100 further makes it possible to very easily control the etching reaction and the etching rate and reduce the aggressiveness of the gaseous etching medium used, which also reduces the potential chemical corrosion of gas lines and the interior of the reaction chamber.

By using a diluted inert gas, it is further possible to work even at atmospheric pressure by limiting the partial pressure, for example of chlorine trifluoride or bromine trifluoride, to a range of some 10 mbar by correspondingly diluting these gases with helium, which is still sufficient for maximum etching rates, yet also allows the etching process to be efficiently controlled through the inflow of the etching species.

When using the noble gas fluoride xenon difluoride, the latter must first be thermally sublimed from a solid source. In this case, the process pressure when etching the sawn-out silicon elements is thus limited to the vapor pressure of xenon difluoride at the selected working temperature, for example 2 mbar at 20° C.

If iodine pentafluoride is used as the etching medium, the latter must first be converted to the gaseous phase in an evaporator, which limits the working pressure to approximately 20 mbar. Alternatively, however, one can also use a "bubbler" to "bubble" the liquid iodine pentafluoride with an inert gas, for example helium, and supply the gas mixture diluted in this manner to the reaction chamber. Both procedures are available.

After introducing the gaseous etching medium into the reaction chamber, the actual etching of the sawn-out silicon elements begins, where specifically the damaged areas in the crystalline structure, known as damage zones, which maybe on the sawn edge are stripped, and the sawn surfaces are planarized.

The gaseous reaction products produced from the reaction between the gaseous etching medium used and the silicon surfaces are either pumped away continuously, if a through-flow system is used, or accumulate in a reaction chamber that is filled once and then closed, until all gaseous substances are finally pumped out of the reaction chamber upon completion of silicon element etching.

In any case, pumping must continue for a sufficiently long period, a discharge pressure during pumping must be low enough, which may be than 0.1 μbar, to ensure that the reaction chamber no longer contains any leftover etching gas before the silicon elements sawn out of the silicon wafer and located on the sawing sheet are discharged from the reaction chamber of the reactor either through the load lock or via the loading device.

When discharging the elements, it is further suitable to also provide a vacuum in the load lock between the reaction chamber and the surrounding atmosphere. This vacuum preferably has a pressure of less than 0.1 μbar, which can be easily achieved by using a turbomolecular pump.

In doing this, the wafer that has been sawn into silicon elements and is attached to the sawing sheet is preferably reheated in the load lock after etching, for example using a radiation heater. This removes as much leftover etching species as possible before the wafer is removed from the load lock, i.e., leftover gaseous etching medium or leftover gaseous reaction products from the sawn-out, overetched silicon elements or from their surfaces affected by etching.

Leftover media of this type remaining on the surface of the silicon element would result in corrosion when exposed to air, due to the effect of moisture in the air.

After the processed silicon elements have been discharged from the reactor, they are finally removed individually from the sawing sheet and built up into diodes in an available manner. The silicon edges are then passivated in an available manner to ensure the stability of the pn junctions and the high performance of the silicon power diodes over their life cycles.

What is claimed is:

1. A method for substantially eliminating at least one of eruptions, impurities and damage in a crystal lattice, the method comprising the steps of:
providing a surface-plated, sawn-out part of a silicon wafer;
selectively drying the at least one silicon element by heating the at least one silicon element with a radiation heater in a vacuum at a pressure of less than about 0.1 µbar; and
selectively etching at least one silicon element of the surface-plated, sawn-out part of the silicon wafer by bringing at least an area of the at least one silicon element into contact with a gaseous etching medium for etching silicon selectively in a chemical reaction, wherein gaseous reaction products are produced during the step of selectively etching.

2. The method of claim 1, wherein the gaseous etching medium includes a fluoride compound of the XFn type.

3. The method of claim 1, wherein the gaseous reaction products include silicon tetrafluoride.

4. The method of claim 1, wherein the step of selectively etching is performed at a pressure of 0.1 mbar to 1,000 mbar.

5. The method of claim 1, wherein the gaseous etching medium is diluted with an inert gas to control an etching rate.

6. The method of claim 1, wherein at least a part of the gaseous etching medium is one of: convertable from a solid phase to the gaseous phase by thermal sublimation using a solid source; convertable from a liquid phase to the gaseous phase by introducing an inert gas using a bubbler; and convertable from one of the liquid phase and the solid phase to the gaseous phase based on a vapor pressure at a temperature.

7. The method of claim 1, further comprising the step of adjusting an etching rate while selectively etching the at least one silicon element by selecting at least one of the gaseous etching medium, a composition of the gaseous etching medium and an etching temperature.

8. The method of claim 1, further comprising the step of removing the gaseous reaction products produced during the step of selectively etching at least one of during the step of selectively etching and after the step of selectively etching.

9. The method of claim 1, further comprising the step of removing, after performing the step of selectively etching in a reaction chamber, at least one of a leftover etching medium and a leftover reaction product from at least one etched silicon element in a vacuum in a load lock, the step of removing being performed at a pressure of less than about 0.1 µbar and at a temperature higher than during the step of selectively etching.

10. The method of claim 1, wherein the step of selectively etching includes selectively etching an edge of a power diode.

11. The method of claim 1, wherein the at least one silicon element is sawn from the silicon wafer prior to performing the step of selectively etching.

12. The method of claim 11, wherein the silicon wafer is attached to a carrier, and the carrier is a sawing sheet clamped into a frame.

13. The method of claim 11, wherein the at least one silicon element is initially left on a carrier after the at least one silicon element has been sawn out and treated while still attached to the carrier.

14. The method of claim 13, further comprising the step of expanding the sawing sheet after sawing out the plurality of silicon elements and before performing the step of selectively etching to increase a distance between the at least one silicon element and another silicon element, wherein the frame is used as an expansion frame for the sawing sheet.

15. A method for etching, comprising:
exposing a silicon element to a first heat treatment in a vacuum at a first elevated temperature;
selectively etching the silicon element with a gaseous etching medium and forming gaseous reactive products, wherein the gaseous etching medium comprises chlorine trifluoride; and
exposing, subsequent to the selective etching, the silicon element to a second heat treatment in a vacuum at a second elevated temperature;
wherein at least one of the first and the second heat treatment is implemented with a radiant heating at a pressure of less than 0.1 µbar.

16. A method for etching, comprising:
exposing a silicon element to a first heat treatment in a vacuum at a first elevated temperature;
selectively etching the silicon element with a gaseous etching medium and forming gaseous reactive products, wherein the gaseous etching medium comprises chlorine trifluoride; and
exposing, subsequent to the selective etching, the silicon element to a second heat treatment in a vacuum at a second elevated temperature;
wherein at least one of the first and the second heat treatment is accomplished in a vacuum lock chamber.

17. A method for etching, comprising:
exposing a silicon element to a first heat treatment in a vacuum at a first elevated temperature;
selectively etching the silicon element with a gaseous etching medium and forming gaseous reactive products, wherein the gaseous etching medium comprises chlorine trifluoride;
exposing, subsequent to the selective etching, the silicon element to a second heat treatment in a vacuum at a second elevated temperature, wherein at least one of the first and the second heat treatment is accomplished in a vacuum lock chamber;
transferring, subsequent to the first heat treatment, the silicon element from the vacuum lock chamber to a reaction chamber; and
transferring, prior to the second heat treatment, the silicon element from the reaction chamber to the vacuum lock chamber.

* * * * *